April 11, 1961 H. G. PACK 2,979,551

THERMOELECTRIC GENERATOR

Filed March 2, 1959 3 Sheets-Sheet 1

INVENTOR
HERSCHEL G. PACK
BY Munn & Liddy
ATTORNEYS

April 11, 1961 H. G. PACK 2,979,551

THERMOELECTRIC GENERATOR

Filed March 2, 1959 3 Sheets-Sheet 2

INVENTOR.
HERSCHEL G. PACK
BY
Munn & Liddy
ATTORNEYS

April 11, 1961 H. G. PACK 2,979,551

THERMOELECTRIC GENERATOR

Filed March 2, 1959 3 Sheets-Sheet 3

INVENTOR.
HERSCHEL G. PACK
BY
Munn & Liddy
ATTORNEYS

United States Patent Office 2,979,551

Patented Apr. 11, 1961

2,979,551

THERMOELECTRIC GENERATOR

Herschel G. Pack, 4308 Modoc Road, Santa Barbara, Calif.

Filed Mar. 2, 1959, Ser. No. 796,403

8 Claims. (Cl. 136—4)

My invention relates to improvements in thermoelectric generators and it consists in the combinations, constructions and arrangements hereinafter described and claimed.

An object of my invention is to provide a thermoelectric generator in which the mechanical arrangement and construction is such as to provide a maximum of generating efficiency, while at the same time withstanding the damaging effects of heat. The device also makes any unused heat available for other use or for additional generation. The thermoelectric generator consists basically of a group of thermoelectric elements connected in electrical series. In certain cases the thermoelectric elements would be connected in electrical parallel for certain modes of operation.

Other objects and advantages will appear as the specification continues and the novel features will be set forth in the appended claims.

*Drawings*

For a better understanding of my invention, reference should be had to the accompanying drawings, forming part of this specification, in which Figure 1 is a longitudinal section through one of the thermoelectric elements;

While I have shown only the preferred forms of my invention, it should be understood that various changes or modifications may be made within the scope of the annexed claims without departing from the spirit thereof.

*Detailed descriptions*

Figure 1:
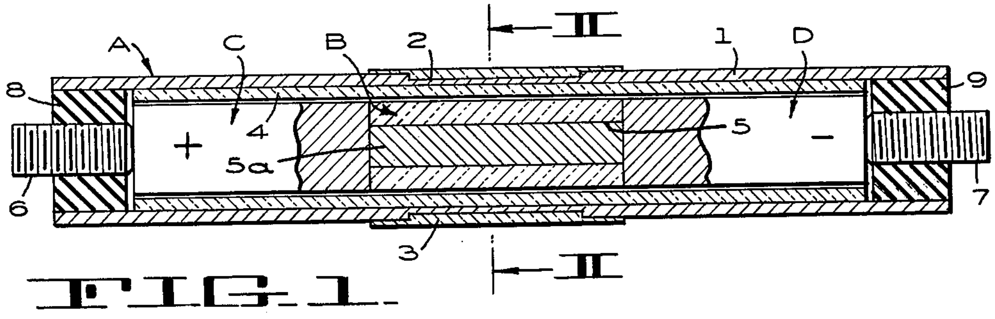
Figure 2:
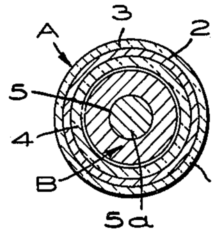
Figure 2 is a transverse section taken along the line II—II of Figure 1.
Figure 3:
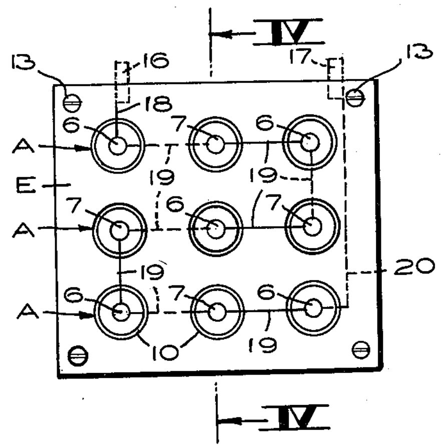
Figure 3 is an end view of Figure 4 and shows a number of the thermoelectric elements extending through openings provided in the end pieces.

In Figure 1, I show a cross section of a unit thermocouple A, which is used in the thermoelectric generator Z, hereinafter described. The thermocuple comprises a thin-walled metal cylinder 1, which may be one and one half inches long and about one fourth inch in diameter. I do not wish to be confined to these measurements, since they are merely given by way of example. The thin metal cylinder is made of a heat resistant metal such as Inconel or better. Tungsten is preferable to use, but it is difficult to fabricate this metal. Between these two extremes of metal, there are numerous other metals or alloys which could be used as the material for the thin-walled cylinder.

The mid portion of the cylinder 1, has an annular groove 2, so as to reduce the cross sectional area at this point. A thin coating 3, of refractory ceramic material fills the groove 2, and the purpose of the coating is to protect the cylinder 1 from the deteriorating effects of heat. The inner surface of the metal cylinder 1 is lined with a thin layer 4, of ceramic material for the greater part of the cylinder's length. This inner layer of ceramic affords an electrical insulation for the thre elements B, C and D, mounted within the cylinder.

I mount the three rod-like elements B, C and D, within the ceramic insulating layer 4, so that they are free to slide within the cylinder. The center element B is only for electrically connecting the active or current producing elements C and D, and conveying heat thereto. The center heat-transferring element B may be a solid metal rod or of a special construction to attain certain effects such as a tube of quartz or ceramic with a bore 5, of small diameter in which is placed an electrically conductive material of a higher electrical resistance in reduced cross section than the active elements C and D. Tungsten or tungsten carbide 5*a*, could be placed in the bore 5.

Thermoelectric element materials cover a very wide range from pure metals to semi-conductors and my invention seeks to provide optimum conditions for all types of metals used in forming the active elements C and D, and the center element B. Metallic elements tend to have low electrical resistance and change little with temperature changes. Such metallic elements produce low voltage. An example would be a positive copper current-producing element C and a nickel negative current-producing element D, both being in contact with the center element B.

Semi-conducting elements on the other hand, tend to be of a high resistance normally, and produce a relatively high voltage. Their resistance, however, is much lower when hot and the resistance also decreases under mechanical pressure. Such semi-conducting elements do not follow Ohm's law, that is, their resistance drops with an increase in applied voltage. An example of a semi-conductor thermocouple would be a positive element C of copper sulphide and a negative element D of lead sulphide.

Alloy couples lie between good metal electrical conductors and semi-conducting elements. An example of a negative alloy would be a Monel metal, of copper and nickel and a positive alloy of zinc and antimony. In addition, it is possible to have positive or negative elements C and D, made specifically to produce certain characteristics. This is accomplished by "doping" as in transistor materials and by various processes. "Doping" is a term much used in electronic literature and refers to the process of refining a material to a high purity and then adding minute amounts of a selected impurity to attain desired electrical properties.

One group of thermocouple elements C and D is made of ceramic-like metallic oxides which become conductive at high temperatures. Elements of bismuth telluride are "doped" to produce couples for the "Peltier Effect" which is a process of passing an electric current in the proper direction across a thermoelectric junction and thereby lower the temperature of the junction.

The active elements C and D, are any two electrically conductive dissimilar materials. The elements C and D are held in electrical contact with the center element B, by adjustable screws 6 and 7, mounted in silicone rubber end plugs 8 and 9, respectively. The three elements B, C and D, are sealed in the cylinder 1, at all times to prevent oxidation, and are under pressure to insure good electrical connection.

If heat were applied to the ceramic layer 3, at the center of the cylinder, the resulting expansion would quickly loosen contact between the three elements B, C and D, creating high resistance and probably destroying contact altogether. The silicone rubber end plugs 8 and 9 could not stand the heat and would have to be cooled in some way. In all instances it is desirable to effect good electrical contacts and protect the elements B, C and D, from the damaging effects of heat and air.

I want to apply heat to the center of the cylinder 1, and I want to cool the ends of the cylinder to maintain a temperature differential between the center and the ends. In addition I want to apply pressure against the cylinder ends and I want to use the screws 6 and 7, as electrical connections for wiring. I mount a plurality of the cylinders 1, in a thermoelectric generator Z, of the type shown in Figures 3 to 6 inclusive. It is best to describe the construction of the generator Z, at the present time.

In the thermoelectric generator, I can have from one to an infinite number of unit thermocouples A. A generator would probably have one hundred such unit thermocouples. For purpose of illustration, I have shown only nine unit thermocouples A, in the generator Z, of Figures 3 to 6 inclusive. I use two stainless steel end pieces E and F and drill nine holes 10 in each. I place the nine cylinders 1, of the unit thermocouples A, in the nine aligned holes in the end pieces E, and F, and braze or otherwise secure the cylinders in place so that their ends will project beyond the end pieces as clearly shown in Figure 4. This provides a rigid metal structure.

Figure 4:
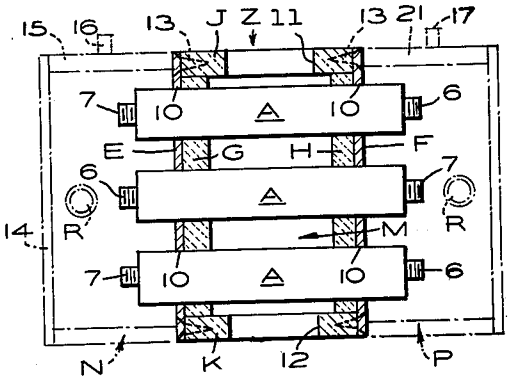
Figure 4 is a section taken along the line IV—IV of Figure 3, and shows the thermoelectric elements supported by two end pieces. A heating chamber is formed between the two end pieces and a hot fluid is passed through the chamber for heating the central portions of the thermoelectric elements.

I now place a layer of heat-resistant material on the inside wall of each end piece E and F. In Figure 4, these two layers are shown at G and H. I then provide top and bottom ceramic pieces J and K, that extend between the two end pieces E and F, and I also provide side ceramic pieces L. All of these pieces provide a heating chamber M, that lies between the end pieces E and F. It is necessary to circulate hot fluid around the centers of the unit thermocouples A, so I provide the top piece J with an outlet opening 11, and the bottom piece K with an inlet opening 12. Screws 13, or other suitable fastening means may be used for securing the end pieces E and F, to the top and bottom ceramic pieces J and K. The screws should not extend between the end pieces E and F.

Figure 5:
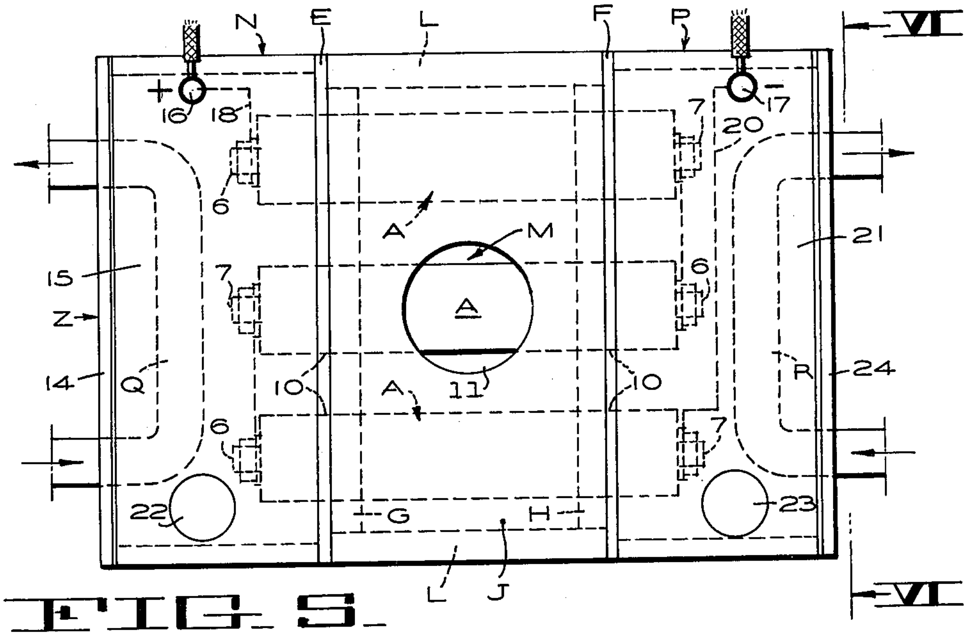
Figure 5 is a top view of Figure 4 and illustrates a cooling tank connected to each end piece and enclosing the projecting ends of the thermoelectric elements.

It is further necessary to provide two cooling tanks to enclose the ends of the cylinders 11, projecting from the end pieces E and F. In Figure 5, I show two cooling tanks N and P, one tank being placed at each end of the heating chamber M. The cooling tank N, consists of four walls forming a rectangle and the edges of the walls are attached to the end piece E, so as to make a liquid-tight fit therewith. A cover plate 14, is secured to the other or exposed edges of the four walls by screws and a liquid-tight compartment is formed. The top wall 15, for the cooling tank N, has an electrode 16, extending therethrough and this electrode is insulated from the top wall. A wire 18, leads from the inner end of the electrode 16, to the screw 6, of one of the unit thermocouples A. The nine thermocouples A, are connected in series in Figure 3, and adjacent thermocouples are reversed in their positions so that only short wires 19, need be used to connect them in series with each other. The screw 7, of the last thermocouple A, is then connected by a wire 20, to another electrode 17, which is mounted in and insulated from the top 21, for the cooling tank P. If the thermocouples A, are connected in parallel, instead of series, all of the screws 6, of the thermocouples would be arranged in one cooling tank N, and all of the screws 7, of the same thermocouples would be arranged in the other cooling tank P. All of the screws 6, would be connected to each other and to the terminal 16, while all of the screws 7, would be connected to each other and to the terminal 17.

The metal end pieces E and F, are thicker than the walls of the metal cylinders 1. The tanks N and P, have pressure filler caps 22 and 23, in their tops and these caps are removed when the tanks are filled with fluid. The ends of the metal cylinders 1, project into the fluid. The openings 11 and 12, for the heating chamber M, are for the intake and exhaust of the heating fluid. The fluid would normally be combustion gases from burning fuel, but could be engine exhaust gases, heated air or a hot liquid. The heated fluid would enter the chamber M, by the inlet 12, and would leave the chamber by the outlet 11.

Figure 6:
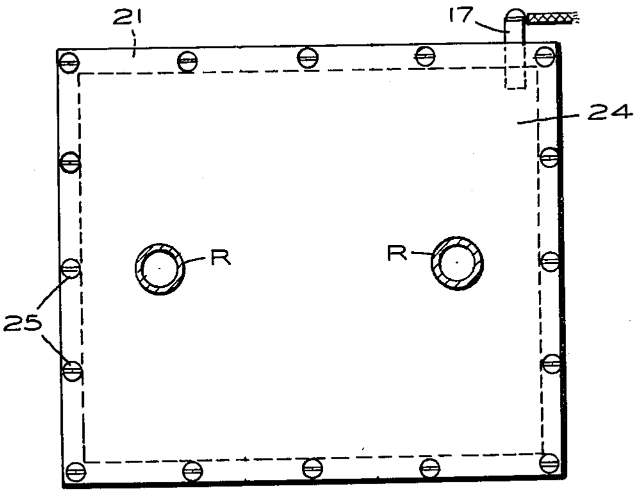
Figure 6 is an end view of Figure 5 when looking in the direction of the arrows VI—VI of Figure 5.

The cooling tank P, is closed by a cover plate 24, and Figure 6 shows the plate secured in place by screws 25. The two cooling tanks N and P, have metal tubes Q and R, in them, respectively, through which water or other cooling fluid is circulated to remove heat from the cooling fluid in the tanks. The water flowing through the tubes Q and R, would be heated by the fluid in the tanks N and P, and this heated water could be used elsewhere. The fluid in the tanks N and P, would be a non-conductor of electricity such as silicone. The tanks N and P, are preferably made of stainless steel and may be heat insulated in the same manner as boilers or hot water tanks are insulated. Gaskets may be placed under the cover plates 14 and 24, to insure a fluid tight seal.

The ends of the unit thermocouples A, that extend into the tanks N and P, are cooled by the fluid in these tanks and the ends will also be under hydrostatic pressure from the pressure of the silicone fluid in the tanks. Heat is transferred from the cylinders 1, to the active elements C and D, by the central heat transfer element B, and in addition, any electric current flowing through the active elements C and D, will generate heat in the heat transfer element B, where it will assist in thermoelectric generation of a current. The heat applied to the central area of the cylinders 1, by the hot fluid flowing through the heating chamber M, will be quickly conducted through the thin cylindrical wall to the center heat transfer element B, which acts as a heat reservoir to accumulate heat and to heat the inner ends of the generating elements C and D. The elements C and D, in general, are relatively poor heat conductors. The thin cylinder walls of the unit thermocouples A, likewise offer a poor heat conductive path outward; hence the temperature tends to build up in the center section. The heat which does flow into the electrical generating elements C and D, in most cases, tends to lower their electrical resistance, a desirable feature as long as one end is at a much higher temperature than the other. How the special heat transfer element B, would likewise perform is evident and additional heat would be internally generated. This would, of course, be at the expense of adding some extra resistance to the generator.

As already stated, the bore 5, of the center element B, is preferably filled with tungsten or tungsten carbide. Neither material has a higher specific resistance than the average thermoelectric element material, but due to the greatly reduced cross section of either of these two elements in the bore 5, of the quartz tube B, the resistance of this center element is greater than that of either the positive element C, or the negative thermoelectric element D. This is comparable to an ordinary electric lamp bulb where the small diameter tungsten filament heats to white heat while the supporting wires remain cool when current flows through the circuit. Therefore, the high resistance tungsten **5*a*** will be heated.

The silicon rubber end plugs 8 and 9, are fluid cooled by the fluid in the tanks N and P. The same fluid exerts an elastic pressure against the plugs to in turn cause the inner ends of the screws 6 and 7, to maintain good electrical contact between the elements C, D and B, in the cylinders 1. The screws 6 and 7, are for attaining initial contact and for readjustment if required. The same hydraulic pressure on all of the cylinder ends by the silicon fluid in the cooling tanks, ensures uniform pressure and therefore good electrical contacts among the elements B, C and D, in each cylinder 1, at all times. The unit thermocouples A, are connected to each other in series to attain a higher voltage or they are connected in parallel to attain a higher current.

The use of a high resistant material 5*a* of a reduced cross section because of the bore 5, provides a good heat transfer unit B. I have shown an arbitrary number of unit thermocouples A, and an arbitrary size of heating chamber M, in order to give one illustration of the thermoelectric generator. An actual model would probably have one hundred unit thermocouples arranged in ten rows with ten units being in each row. It is desirable to have the heating chamber as narrow as practicable in order to limit the heating to the center portion of the unit thermocouple A. The metal tubes Q and R, for cooling the silicone fluid in the cooling tanks N and P, would be bent to expose more area of the tube walls to the fluid. The generator Z, will be surrounded by heat insulating material.

Consideration is now given to the electric circuits shown in Figures 7 to 10, inclusive. In its simplest form, a group of thermocouples A, are connected in electrical series and when heat is applied to the heating chamber M, a voltage appears across the electrodes or terminals 16 and 17. If, instead of heating the chamber M, I connect a source of direct current to the output terminals 16 and 17, in opposite polarity to that for generating electricity, so that the negative wire would be connected to the positive terminal 16, and the positive wire would be connected to the negative terminal 17; cold will be produced in the heating chamber M, and heat will be produced in the cooling tanks N and P. My invention is particularly well adapted to operate either to generate current or to produce refrigeration. For the latter process, special elements, for example doped bismuth telluride, are used.

Figure 7:
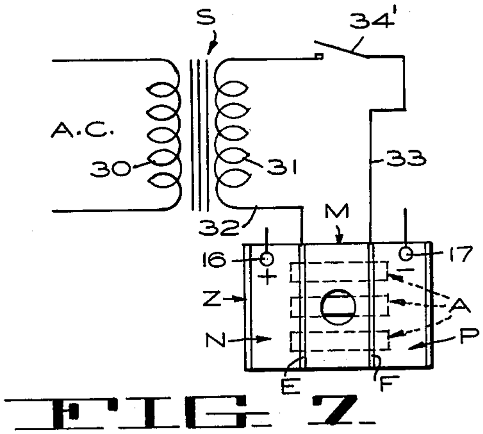
Figures 7 to 10 inclusive are various wiring diagrams showing different uses of the thermoelectric generator.

Referring to Figure 7, I have shown how my thermoelectric generator can have its unit thermocouples A, heated by an alternating electric current instead of by a heated fluid flowing through the heating chamber M. A step down transformer S, has its primary coil 30, connected to a source of alternating electric current and has its secondary coil 31, connected to the metal end pieces E and F, of the generator by wires 32 and 33. A switch 34′ is placed in the secondary circuit for connecting the metal end pieces to the alternating current. The unit thermocouples A, have their metal cylinders 1, brazed to the metal end pieces E and F, and therefore all of the metal cylinders will be connected in electrical parallel with the secondary circuit flowing through the wires 32 and 33. The unit thermocouples will have their central portions heated by offering resistance to the alternating current and the thermocouples A, will deliver a direct current to the terminals 16 and 17, because the thermocouples are electrically connected to the terminals. The step down transformer S, is preferably of the type used in spot welding. The electrical heating of the centers of the unit thermocouples is enhanced because the metal cylinders 1, are reduced in cross sectional area by the annular grooves 2. The arrangement shown in Figure 7 can use a source of alternating current to produce heat in the unit thermocouples A, and these in turn will generate a direct current.

Figure 8:
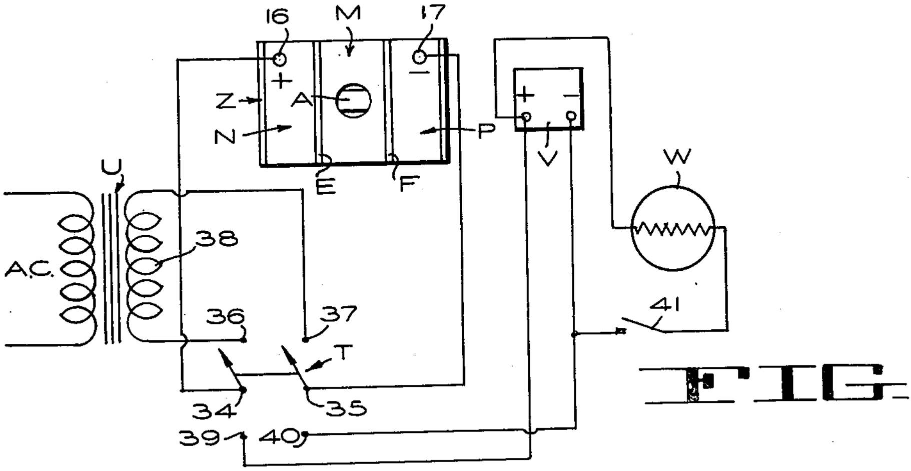

Another method of using external voltage to heat the thermocouples A, and produce a direct current is shown in Figure 8. Assume that all of the unit thermocouples A, are loaded with generating elements C and D, separated by the special heat conducting center element B, and that the output terminals 16 and 17, of the generator are connected to the center terminals 34 and 35, of a double pole double throw switch T. Now, when the switch T, is thrown to close the terminals 36 and 37, the terminals 16 and 17, are connected to the secondary 38, of a transformer U, and current flowing in the secondary circuit will generate heat, mostly in the heat transfer elements B, because they are of a higher resistance than the elements C and D. The terminals 16 and 17, could be connected to direct current if desired. The heat will be stored in the transfer elements B.

Now when the switch T, is thrown to the other position and connects with terminals 39 and 40, thermoelectric generation from the stored heat in the transfer elements B, will flow into the external circuit that leads to a storage battery V, or a work load W. A switch 41, is used for connecting the work load to the storage battery. The work load W, can be connected directly to the terminals 39, and 40, without the switch 41, if desired. It is thus seen that by alternately throwing the switch T, from one position to the other, a voltage is produced and an external current will flow. It will of course be obvious that electric heating of the unit thermocouples can be used in conjunction with other heating such as gases of combustion flowing through the heating chamber M.

Figure 9:
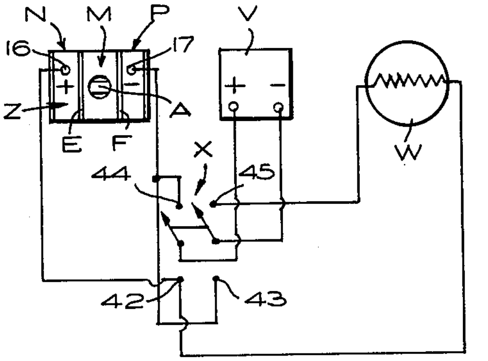

Consideration will now be given to means of feeding the output of the thermoelectric generator back through the generator to increase its efficiency. In Figure 9, when the double pole double throw switch X, connects with the terminals 42 and 43, the output of the generator Z, will flow into the storage units which may be the storage battery V, or a capacitor, not shown. When the switch X, is thrown to the other position and connects with terminals 44 and 45, the storage unit V, will be in series with the thermoelectric generator and will discharge through the generator into the load W.

Figure 10:
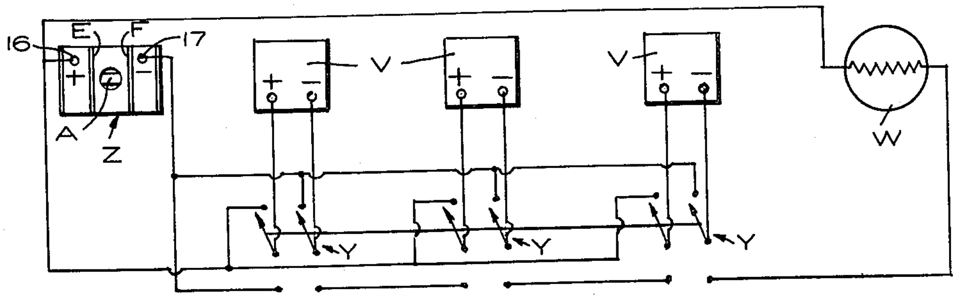

In Figure 10, I show a multi-pole double throw switch Y, for connecting a plurality of storage units, such as the storage batteries V, with the thermoelectric generator Z, so that the batteries will be charged in parallel. A throwing of the switch Y, into its other position will connect the storage batteries in series with each other and in series with the work load W. The batteries V, will therefore be charged in parallel and discharged in series.

I have shown how electric current fed back through the thermoelectric generator Z, can be used to produce heat to increase the output of the generator. Another advantage of the feed back of electricity to the generator results in the non-linear resistance of many thermoelectric element materials to the electric current. This means that the resistance of the elements C and D, drops in proportion to the applied voltage. Therefore it is obviously advantageous to discharge the storage devices V, in series through the generator Z. This is an advantage in addition to the general advantages of attaining as high an operating voltage as possible.

It will be seen that the only moving mechanical part in the generator Z, and the associate electric circuit in Figure 10, is the multi-pole double throw switch Y. The switch Y, may be motor driven, which is preferable or be in the form of a relay. Little power is required to operate such a switch Y, and timing and cycling can be adjusted to conditions optimum for the particular operation.

In the structure of the thermoelectric generator Z, shown in Figure 5, the thermoelectric elements B, C and D, are connected in electrical series and are at all times electrically insulated from the metal cylinders 1, by the insulating sleeves 4, and therefore are insulated from all metal parts of the generator. The series circuit in each unit thermocouple A, and the connecting of the thermocouples in series can be referred to as the thermoelectric circuit. The silicone fluid in the cooling tanks N and P, is of course an electrical insulator and therefore the wires connecting the thermocouples will not be short circuited.

The parallel circuits mentioned in Figures 7 and 8, is a heating circuit and is a means of applying heat to the central portions of the metal cylinders 1. The principle of using electricity for heating the metal cylinders 1, makes use of the cylinders themselves as resistance elements and therefore the cylinders will be heated. The resistance of a group of metal cylinders 1, in parallel would be very low, but a heavy current at very low voltage would heat them very well. Such electric heating is obtainable from alternating current from a transformer. Since the centers of the metal cylinders 1 are thinner, the resistance will be greater and the heat will tend to localize in these portions. By this means I can use alternating current to produce heat in the generator Z, and the generator in turn will produce direct current electricity by thermoelectric action. Both the input electric circuit into the generator Z, and the output direct current circuit can and do function simultaneously.

A short round rod of copper or other metal can be used for the heat transfer element B. The special heat transfer element of quartz having the bore 5, filled with tungsten 5a is for the purpose of generating internal heat when an electric current flows through the tungsten. There are thousands of materials which will yield a thermoelectric voltage when the materials are heated. Optimum operating conditions vary with the change of the elements B, C and D, and hence many variations of elements may be used in the generator Z.

The wiring diagrams of Figures 9 and 10 are more than a simple means of electrical storage for the output of the generator Z. These wiring diagrams might be thought of as analagous to a combustion engine where there is a "compression stroke" and a "power stroke." Here by means of the double throw cycling switches X and Y, the generator output is alternately stored temporarily in the storage batteries or capacitors, and then discharged through the generator Z, to produce a "power stroke" or pulse of power.

I claim:

1. In a device of the type described: a unit thermocouple comprising a metal cylinder; a heat transfer element at the center of the cylinder; a positive current-producing element in the cylinder and contacting with the heat transfer element; a negative current-producing element in the cylinder and contacting with the heat transfer element; a current insulating sleeve separating the central heat transfer element and the positive and negative current-producing elements from the metal cylinder; rubber plugs mounted in the ends of the cylinder and adjacent to the positive and negative current-producing elements; and screws mounted in the plugs and being adjustable for contacting with the positive and negative current-producing elements for holding them in contact with the heat transfer element; said plugs sealing the cylinder ends to prevent the entrance of air into the cylinder and thereby prevent any damage to the contacting surfaces among the elements due to oxidation caused by air.

2. The combination as in claim 1: and in which the metal cylinder has an annular groove midway between its ends; and a layer of ceramic encircling the cylinder and being received in the groove.

3. The combination as set forth in claim 1: and in which the heat transfer element is made of quartz and has a small bore therein extending from end to end of the element and filled with an electrical conductive material of a higher resistance in reduced cross section than the resistances of the positive and negative current-producing elements.

4. A thermoelectric generator comprising a heating chamber including two opposed end pieces with a plurality of openings in one end piece being aligned with a corresponding number of openings in the other end piece; a plurality of thermocouples disposed in the aligned openings and each including a metal cylinder; a central heat transfer element mounted in each cylinder; a positive current-producing element housed within the cylinder and placed at one end and a negative current-producing element housed within the cylinder and placed at the other end of each central heat transfer element; said three elements constituting thermoelectric elements; the ends of the metal cylinders projecting beyond the two opposed end pieces of the heating chamber; an electrical insulating sleeve placed between the three thermoelectric elements and the metal sleeve; a cooling tank enclosing the cylinder ends projecting from one end piece; a second cooling tank enclosing the cylinder ends projecting from the other end piece; insulating plugs closing the ends of the metal cylinders; screws carried by the plugs and contacting with the adjacent ends of the current-producing elements for keeping them in contact with the central heat-transfer elements; an electric non-conducting fluid under pressure filling the two cooling tanks and exerting a uniform pressure against the screws and plugs for maintaining the three elements in each cylinder in contact with each other; wires connecting the screws in an electrical circuit; and means for heating the central portions of the cylinders disposed in the heating chamber for causing the central heat-transfer elements to be heated and in turn heat the two current-producing elements in each cylinder for generating electricity that will flow through the wires forming the electric circuit.

5. The combination as set forth in claim 4: and in which the central portions of the cylinders have annular external grooves; and a layer of ceramic encircling the cylinders and being received in the grooves.

6. The combination as set forth in claim 4: and in which means is provided for cooling the liquid in the two tanks for maintaining the ends of the metal cylinders projecting into the tanks at a cooler temperature than the midportions of the cylinders.

7. A thermoelectric generator comprising a heating chamber including two opposed metal end pieces having openings and arranged parallel to each other so that the openings in one piece are aligned with the openings in the other; a plurality of thermocouples each including a metal cylinder that projects through aligned openings provided in the metal end pieces; the portions of the metal cylinders lying between the end pieces offering resistance to a current flowing from a current source through one end piece, then through the cylinder portions and then through the other end piece and back to the source; the cylinder portions through which the current flows being heated; a central heat transfer element disposed in each cylinder and being heated by the heated cylinder portion; a positive current-producing element and a negative current-producing element disposed in each cylinder, one being disposed at each end of the central element and contacting therewith; an electrical insulating sleeve for insulating the central element and the two current-producing elements from the metal sleeve; said positive and negative current-producing elements when heated by contact with the central heat transfer unit, generating electricity; and wires electrically connected to the active elements for conveying the electricity generated by the active elements.

8. A thermoelectric generator comprising a pair of terminals; a plurality of unit thermocouples electrically connected to the terminals; each unit thermocouple including a metal cylinder housing a central heat transfer element and a positive current-producing element and a negative current-producing element in contact with the central element; an electrical insulating sleeve for insulating the central element and current-producing end elements from the metal sleeve; the central element being heated due to resistance when electricity passes therethrough; and a switch and wiring for connecting the terminals to a source of current for causing current to flow through the three elements in each thermocouple for heating the central elements; said switch being operable for disconnecting the current source from the terminals and for connecting the terminals to an external circuit for storing or using the current for work that is generated by the current-producing elements.

References Cited in the file of this patent

UNITED STATES PATENTS

| | | |
|---|---|---|
| 2,215,332 | Milnes | Sept. 17, 1940 |
| 2,232,961 | Milnes | Feb. 25, 1941 |
| 2,710,936 | Lowry et al. | June 14, 1955 |
| 2,780,765 | Chapin et al. | Feb. 5, 1957 |
| 2,844,638 | Lindenblad | July 22, 1958 |
| 2,844,639 | Jordan | July 22, 1958 |